United States Patent
Liu et al.

(10) Patent No.: US 10,211,257 B2
(45) Date of Patent: Feb. 19, 2019

(54) HIGH DENSITY RESISTIVE RANDOM ACCESS MEMORY (RRAM)

(71) Applicant: STMicroelectronics, Inc., Coppell, TX (US)

(72) Inventors: Qing Liu, Irvine, CA (US); John Hongguang Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/829,397

(22) Filed: Dec. 1, 2017

(65) Prior Publication Data

US 2018/0102395 A1 Apr. 12, 2018

Related U.S. Application Data

(60) Division of application No. 15/293,998, filed on Oct. 14, 2016, now Pat. No. 9,865,653, which is a
(Continued)

(51) Int. Cl.
*H01L 27/24* (2006.01)
*H01L 45/00* (2006.01)
*H01L 23/528* (2006.01)

(52) U.S. Cl.
CPC ........ *H01L 27/2436* (2013.01); *H01L 23/528* (2013.01); *H01L 27/2463* (2013.01);
(Continued)

(58) Field of Classification Search
CPC ............... H01L 23/528; H01L 27/2436; H01L 27/2463; H01L 45/08; H01L 45/1233; H01L 45/1253; H01L 45/145; H01L 45/146; H01L 45/16; H01L 45/1616; H01L 45/1633; H01L 45/1691; H01L 21/823431; H01L 21/845; H01L 27/0883;
(Continued)

(56) References Cited

U.S. PATENT DOCUMENTS

2011/0278528 A1  11/2011 Lung et al.
2011/0278676 A1  11/2011 Cheng et al.
(Continued)

OTHER PUBLICATIONS

International Search Report and Written Opinion for co-pending DE Appl. No. 102015120464.9 dated Dec. 6, 2016 (14 pages).

*Primary Examiner* — Shahed Ahmed
(74) *Attorney, Agent, or Firm* — Crowe & Dunlevy

(57) ABSTRACT

A memory cell includes a substrate layer, with a plurality of silicided semiconductor fins stacked on the substrate layer and spaced apart from one another. A first metal liner layer is stacked on the plurality of silicided semiconductor fins and on the substrate layer. A plurality of first contact pillars are stacked on the first metal liner layer adjacent a different respective one of the plurality of silicided semiconductor fins. A configurable resistance structure covers portions of the first metal liner layer that are stacked on the substrate layer and portions of the first metal liner layer that are stacked on each of the plurality of silicided semiconductor fins. A metal fill layer is stacked on the configurable resistance structure. A plurality of second contact pillars is stacked on the metal fill layer adjacent a space between a different pair of adjacent silicided semiconductor fins of the plurality thereof.

26 Claims, 8 Drawing Sheets

Related U.S. Application Data continuation of application No. 14/960,595, filed on Dec. 7, 2015, now Pat. No. 9,570,512, which is a division of application No. 14/688,597, filed on Apr. 16, 2015, now Pat. No. 9,305,974.

(52) U.S. Cl.
CPC .......... *H01L 45/08* (2013.01); *H01L 45/1233* (2013.01); *H01L 45/1253* (2013.01); *H01L 45/145* (2013.01); *H01L 45/146* (2013.01); *H01L 45/16* (2013.01); *H01L 45/1616* (2013.01); *H01L 45/1633* (2013.01); *H01L 45/1691* (2013.01)

(58) Field of Classification Search
CPC ........... H01L 27/0924; H01L 27/10879; H01L 27/1211; H01L 29/66795; H01L 2029/7858
USPC ....... 257/109, 288, 368, 369, 326, 154, 489, 257/516, 537; 438/151, 197, 199, 171, 438/133, 382, 630
See application file for complete search history.

(56) References Cited

U.S. PATENT DOCUMENTS

| | | |
|---|---|---|
| 2011/0291188 A1 | 12/2011 | Cheng et al. |
| 2012/0193712 A1 | 8/2012 | Bryant et al. |
| 2013/0126821 A1 | 5/2013 | Sekar et al. |
| 2013/0277743 A1 | 10/2013 | Jagannathan et al. |
| 2013/0341733 A1 | 12/2013 | Erickson et al. |
| 2014/0166961 A1 | 6/2014 | Liao et al. |
| 2014/0169062 A1 | 6/2014 | Lee et al. |
| 2014/0203236 A1 | 7/2014 | Chen et al. |
| 2014/0264228 A1 | 9/2014 | Toh et al. |
| 2014/0264229 A1 | 9/2014 | Yang et al. |
| 2015/0048295 A1 | 2/2015 | Park |
| 2015/0228647 A1 | 8/2015 | Chang et al. |
| 2015/0325575 A1 | 11/2015 | Park et al. |
| 2015/0332964 A1 | 11/2015 | Cheng et al. |
| 2016/0247806 A1 | 8/2016 | Cheng et al. |
| 2016/0300839 A1* | 10/2016 | Kim .................. H01L 27/0924 |

* cited by examiner

HIGH DENSITY RESISTIVE RANDOM ACCESS MEMORY (RRAM)

CROSS REFERENCE TO RELATED APPLICATIONS

This application is a divisional of U.S. patent application Ser. No. 15/293,998 filed Oct. 14, 2016, which is a continuation of U.S. patent application Ser. No. 14/960,595 filed Dec. 7, 2015 (now U.S. Pat. No. 9,570,512), which is a divisional of U.S. patent application Ser. No. 14/688,597 (now U.S. Pat. No. 9,305,974), filed Apr. 16, 2015, the disclosures of which are incorporated herein by reference.

TECHNICAL FIELD

The present invention relates to integrated circuits and, in particular, to a semiconductor non-volatile memory of the resistive random access memory (RRAM) type.

BACKGROUND

With respect to non-volatile integrated circuit memory devices, resistive random access memory (RRAM) is an emerging technology. An RRAM device is a memory structure which stores a bit of data using resistance values (rather than electronic charge). Each RRAM cell includes a layer of resistive material whose resistance value can be changed to represent the storage of a logic "0" or a logic "1" bit of data. The resistive material, typically in the form of a dielectric layer, can be made to conduct through a filament or conduction path formed by the application of a first programming voltage across the dielectric layer. In the conductive state, the cell is programmed to store one of the logic "0" or logic "1" data values. The filament or conduction path may be reset, rendering the dielectric layer non-conductive, by the application of a second programming voltage across the dielectric layer. In the non-conductive state, the cell is programmed to store other of the logic "0" or logic "1" data values.

There is a need in the art to provide an RRAM cell structure suitable to high density applications.

SUMMARY

In an embodiment, a non-volatile integrated circuit memory cell comprises: a supporting substrate; a resistive random access memory structure comprising: a first electrode, comprising: a silicided semiconductor fin on said supporting substrate; and a first metal liner layer covering said silicided semiconductor fin; a layer of dielectric material having a configurable resistive property and covering at least a portion of said first metal liner; and a second electrode, comprising: a second metal liner layer covering said layer of dielectric material; and a metal fill in contact with the second metal liner layer; a transistor having a first source-drain terminal connected to one of the first and second electrodes; a source line connected to a second source-drain terminal of the transistor; a word line connected to a gate terminal of the transistor; and a bit line connected to another of the first and second electrodes.

In an embodiment, a resistive random access memory (RRAM) structure comprises: a supporting substrate; a first electrode, comprising: a silicided semiconductor fin on said supporting substrate; and a first metal liner layer covering said silicided semiconductor fin; a layer of dielectric material having a configurable resistive property and covering at least a portion of said first metal liner; and a second electrode, comprising: a second metal liner layer covering said layer of dielectric material; and a metal fill in contact with the second metal liner layer.

In an embodiment, a method comprises: patterning semiconductor material to form a semiconductor fin on a supporting substrate; siliciding the semiconductor fin to produce a silicided semiconductor fin; depositing a first metal liner layer covering said silicided semiconductor fin; depositing a layer of dielectric material having a configurable resistive property covering said first metal liner; depositing a second metal liner layer covering said layer of dielectric material; depositing a metal fill on each side of the silicided semiconductor fin in contact with the second metal liner layer; making electrical contact to the first metal liner layer and silicided semiconductor fin to provide a first electrode of a resistive random access memory (RRAM) structure; and making electrical contact to the metal fill and second metal liner layer to provide a second electrode of the RRAM structure.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-11 which illustrate the process steps in the formation of a resistive random access memory (RRAM) structure for use in a non-volatile memory cell. It will be understood that the drawings do not necessarily show features drawn to scale.

Figure 1:
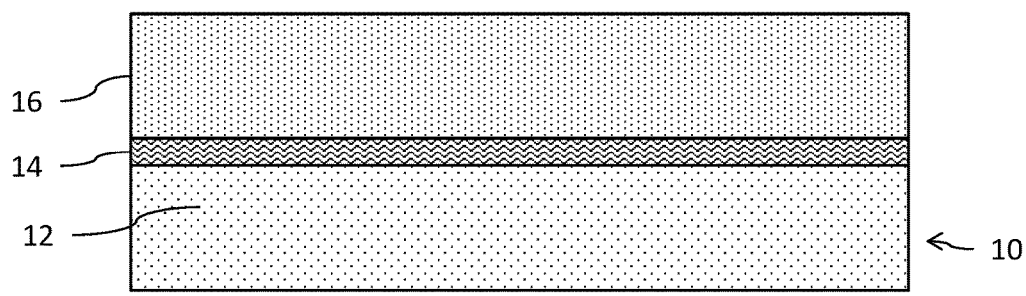
FIGS. 1-11 illustrate process steps in the formation of a resistive random access memory (RRAM) structure for use in a non-volatile memory cell.

FIG. 1 shows a silicon on insulator (SOI) semiconductor substrate 10 comprising a semiconductor substrate 12, an insulating layer 14 and a semiconductor layer 16 in a stack. The semiconductor layer 16 may be doped in accordance with the application, or alternatively may be un-doped in which case the SOI substrate 10 is of the "fully-depleted" type. The semiconductor layer 16 may, for example, have a thickness of 35-50 nm. The insulating layer 14 is commonly referred to in the art as a buried oxide (BOX) layer.

Figure 2:
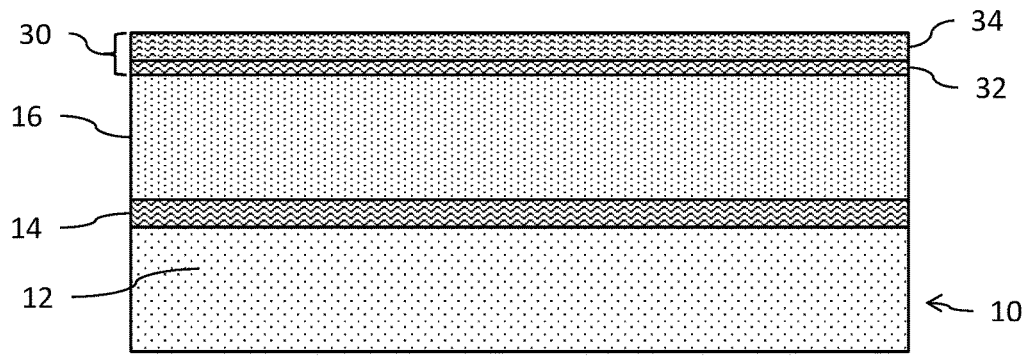

A hard mask 30 comprising a layer of silicon dioxide ($SiO_2$) 32 and a layer of silicon nitride (SiN) 34 is then deposited on the semiconductor layer 16. The silicon dioxide layer 32 may, for example, be deposited using a chemical vapor deposition (CVD) process with a thickness of, for example, approximately 3-10 nm. The silicon nitride layer 34 may, for example, be deposited using a chemical vapor deposition (CVD) process with a thickness of, for example, approximately 20-40 nm. The result is shown in FIG. 2.

Figure 3:
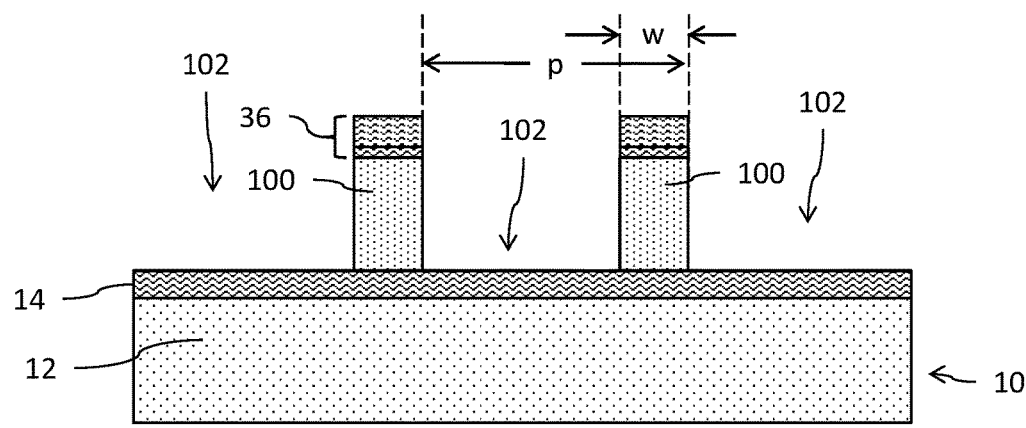

A lithographic process as known in the art is then used to define a plurality of fins 100 from the semiconductor layer 16. The hard mask 30 is patterned to leave mask material 36 at the desired locations of the fins 100. An etching operation is then performed through the mask to open apertures 102 on each side of each fin 100. In a preferred embodiment, the etch which defines the fins 100 extends to a depth which reaches the insulating layer 14. The fins 100 may have a width (w) of 6-12 nm and a pitch (p) of 25-45 nm (with a spacing between adjacent fins of 15-35 nm). The result of the etching process is shown in FIG. 3.

Figure 4:
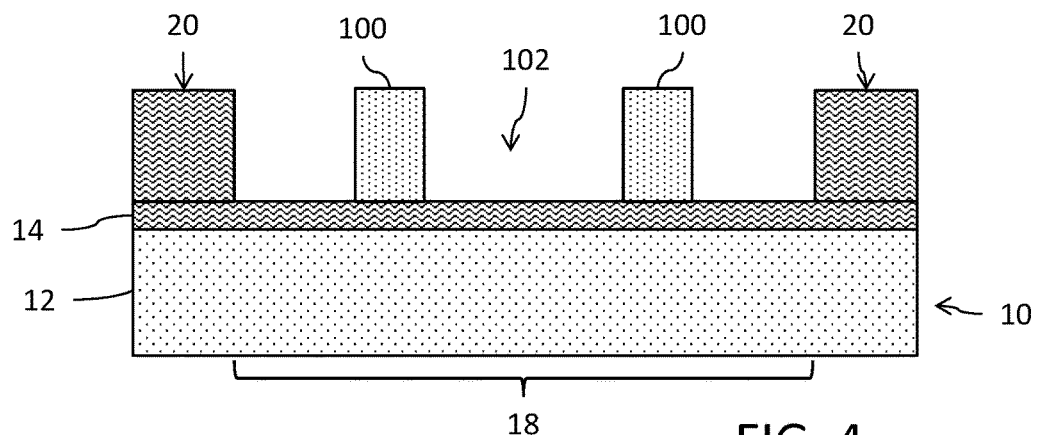

Outside of an area 18 where the fins 100 are located, the insulation such as for the shallow trench isolation (STI) is elevated as shown at reference 20. This may, for example, be accomplished by depositing a flowable oxide on the substrate followed by patterning and removal of the oxide deposit in the area 18 of the fins 100. The mask material 36 is also removed. The result is shown in FIG. 4.

Figure 5:
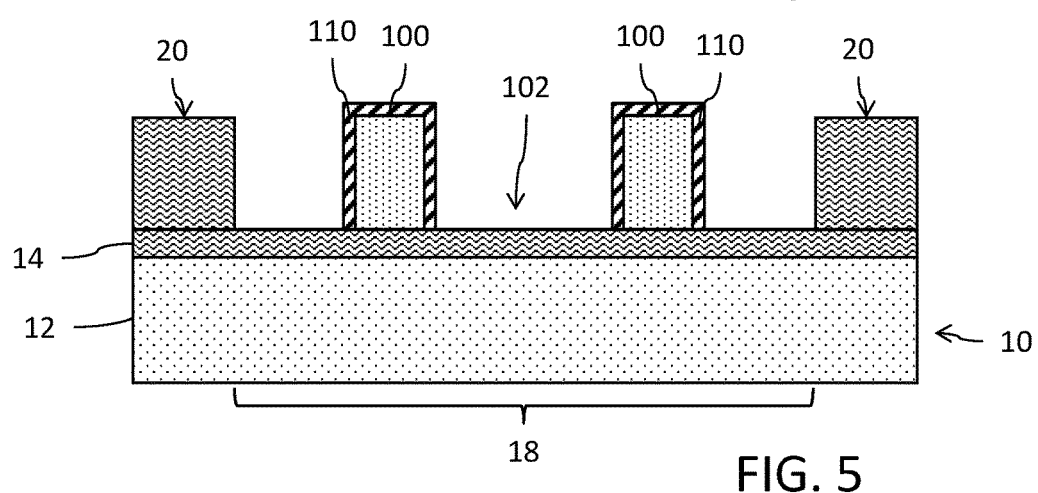
Figure 6:
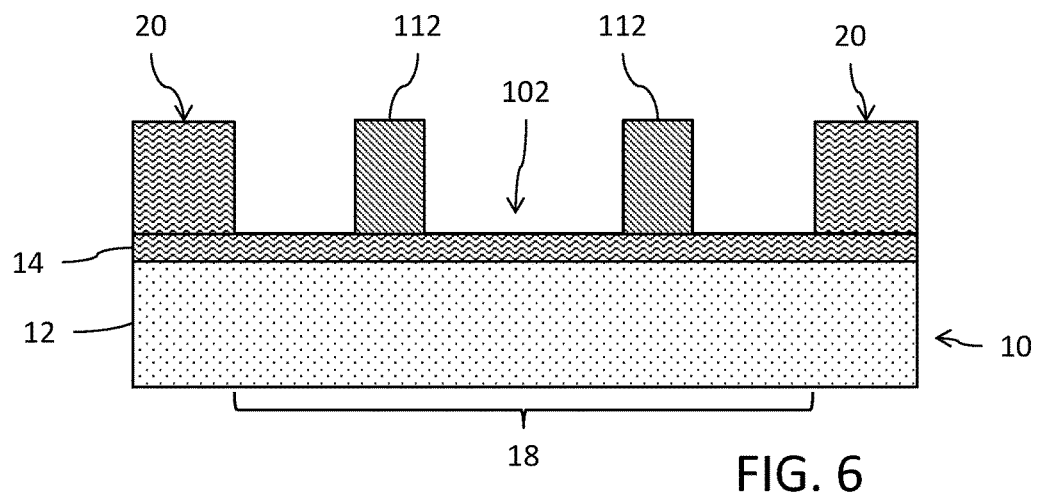

A layer 110 of nickel-platinum (NiPt) is then deposited to cover the fins 100 as shown in FIG. 5. The layer 110 may, for example, have a thickness of 3-10 nm. An anneal is then performed (for example, at 400° C. with an optional laser anneal at 800° C.). The anneal converts at least a portion of the silicon material of the fins 100 to a metal silicide (for example, $NiSi_x$) so as to convert the silicon fin material to form silicided fins 112. The unreacted portion of the layer 110 following the anneal is removed. In an embodiment, the dimensions of the fin 100, the thickness of the layer 110, materials used and characteristics of the anneal performed are selected so that the silicided fins 112 are fully-silicided structures (in such a case, all of the semiconductor material of fin 100 is converted to silicide). The result is shown in FIG. 6. The silicided fin 112 provides one electrode of the RRAM structure.

Figure 7:
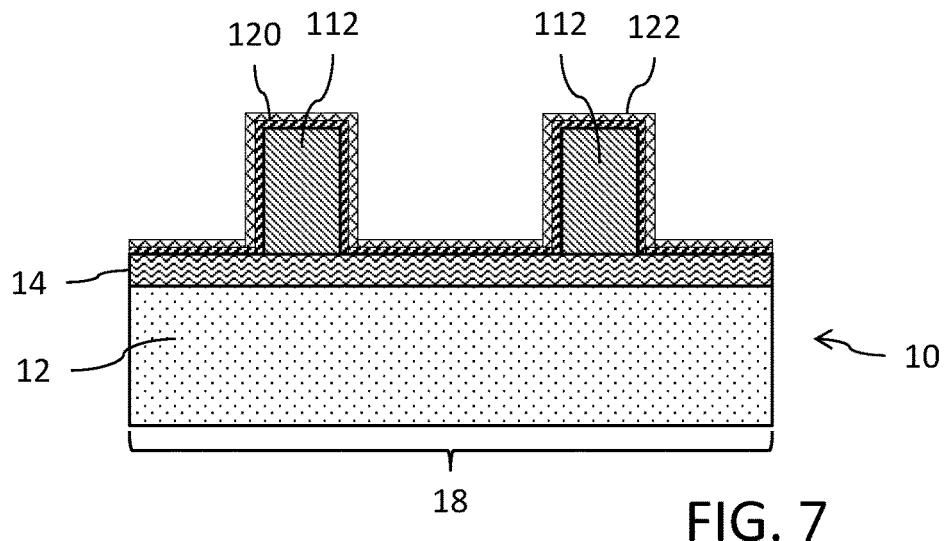

Using a chemical vapor deposition (CVD) process, a liner layer 120 of a metal material (such as, for example, titanium nitride TiN) is deposited to cover the silicided fins 112 and the insulating layer 14. The layer 120 may, for example, have a thickness of 5-10 nm. Using an atomic layer deposition (ALD) process, a layer 122 of a dielectric material (such as, for example, hafnium oxide $HfO_2$) is deposited to cover the metal layer 120. A patterning operation is performed to provide for removal of the layers 120 and 122 outside of the area 18. The result is shown in FIG. 7 which now focuses on the area 18. The layer 120 assists in the formation of a low resistivity state across the dielectric layer 122 for the RRAM operation.

Figure 8:
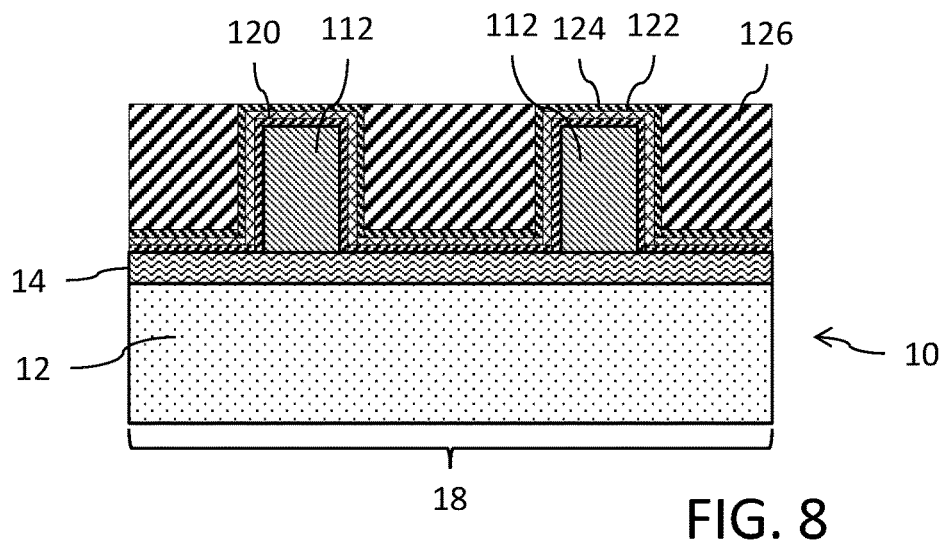

Using a chemical vapor deposition (CVD) process, a liner layer 124 of a metal material (such as, for example, titanium nitride TiN) is deposited to cover the layer 122. The layer 124 may, for example, have a thickness of 5-10 nm. The area 18 is then filled with a metal material (such as, for example, tungsten) to provide a metal fill 126. A chemical-mechanical polishing (CMP) operation is performed to planarize the top surface of the fill 126 at a level which is coplanar with the layer 124. The result is shown in FIG. 8. The layer 124 assists in the formation of a low resistivity state across the dielectric layer 122 for the RRAM operation. The metal fill 126 provides another electrode of the RRAM structure.

Figure 9:
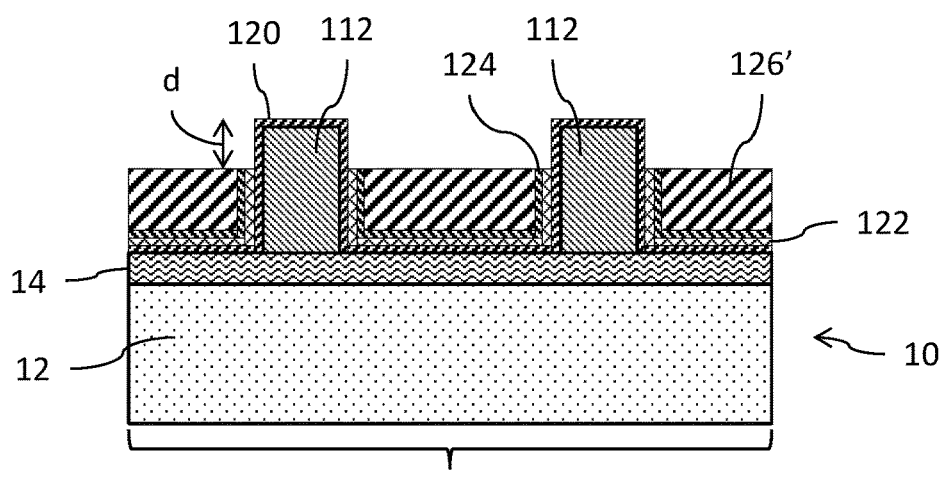

A wet etch process is then used to recess the top surface of the metal fill 126 to a level below the top surface of the silicided fins 112. The depth d of this recess operation may, for example, be 10-20 nm. The portion of the layer 124 located above the top surface of the recessed metal fill 126' is also removed (for example, using a wet stripping process). The portion of the layer 122 located above the top surface of the recessed metal fill 126' is also removed (for example, using a wet stripping process). The result is shown in FIG. 9.

Figure 10:
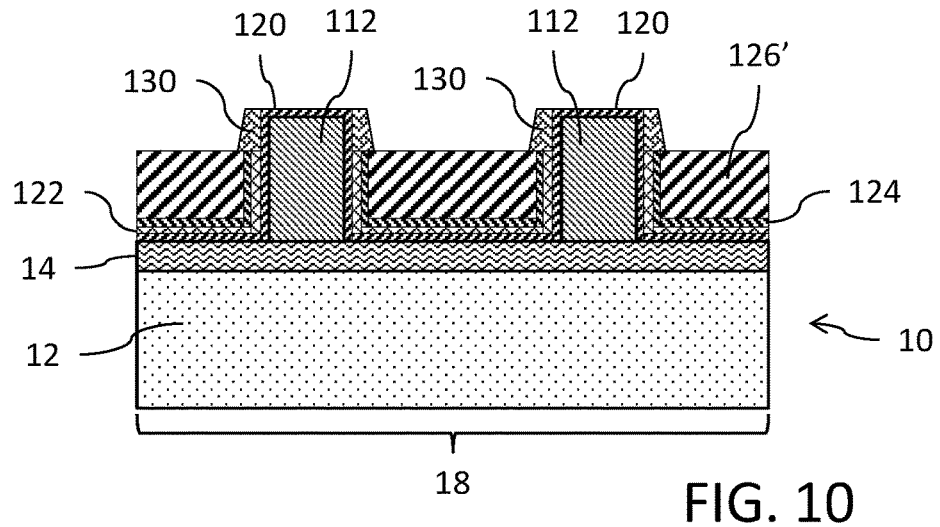

A conformal insulating material deposit is then made with a subsequent directional etch performed to define sidewall spacers 130 on the side surfaces of the layer 120 on each side of the silicided fins 112. The result is shown in FIG. 10.

Figure 11:
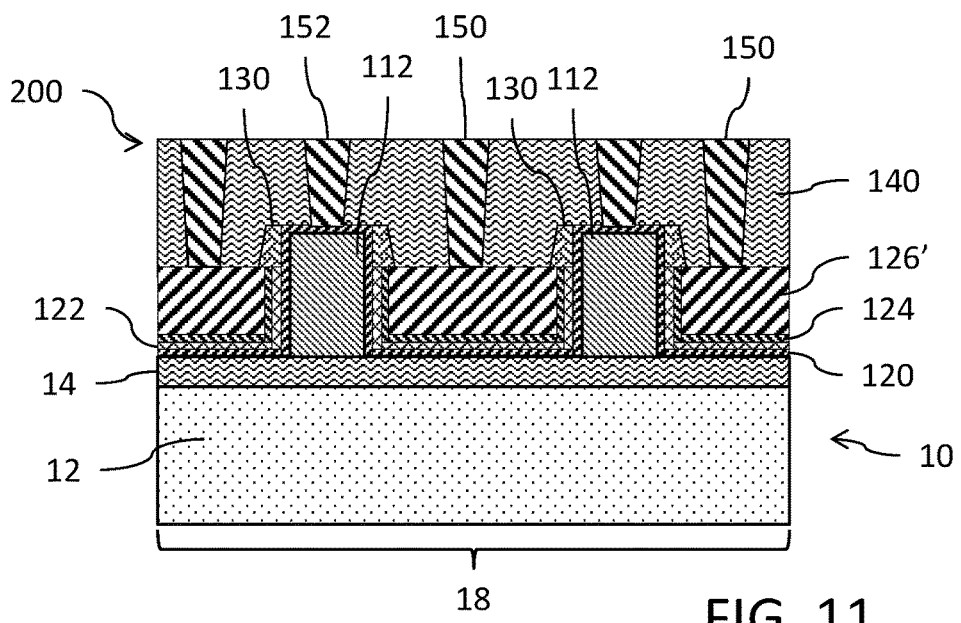

Conventional back end of line (BEOL) processes are then performed to deposit and planarize the premetallization dielectric (PMD) layer 140 and form metal contacts 150 and 152. The result is shown in FIG. 11. One or more metallization layers may then be provided above the PMD layer 140 to assist with making circuit interconnections to the contacts 150 and 152.

Figure 12:
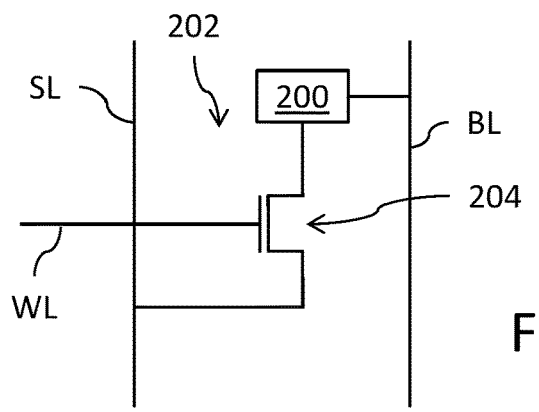
FIG. 12 is a schematic diagram of a non-volatile memory cell incorporating the RRAM structure.

A resistive random access memory structure 200 is accordingly formed to include a first metal plate or electrode (layer 120 on silicided fin 112), a dielectric layer 122, and a second metal plate (layer 124 and recessed fill 126'). It will be noted that the structure 200 is comprised of two fins 112, but this is by example only, it being understood that each structure 200 may be formed from the patterning and siliciding of any suitable number of fins 112. The structure 200 may be included in a non-volatile memory cell 202 as schematically shown in FIG. 12. The cell 202 includes a transistor 204 having a first source-drain region connected to the first metal plate of structure 200 through contact 152 and a second source-drain region connected to a source line SL. The transistor 204 may be supported by and integrated within the substrate 10, with the transistor fabricated prior to or contemporaneously with the fabrication of the structure 200 using well-known transistor fabrication techniques. A word line (WL) for the cell 202 is connected to a gate terminal of the transistor 204. A bit line (BL) for the cell 202 is connected to the second metal plate of structure 200 through contact 150. The source line, word line and bit line may be provided using (and/or coupled to) the metallization layers.

The structure formed supports high density RRAM fabrication because of the use of fins.

Operation of the RRAM structure in a memory cell is as follows: when the word line is set to logic high, the transistor 204 is turned on. The source line is pre-set to logic high. If the bit line voltage is set to >0.85V, a conduction filament is formed in the hafnium oxide dielectric layer. Current rises and the cell enters the low resistive state. The source line is then discharged and the voltage reduces. When the bit line voltage is set lower than −1.25V (which is the reset voltage), and when the word line is set to logic high, the conduction filament dissolves and the cell returns to the high resistive state.

Reference is now made to FIGS. 13-23 which illustrate the process steps in the formation of an RRAM structure for use in a non-volatile memory cell. It will be understood that the drawings do not necessarily show features drawn to scale.

Figure 13:
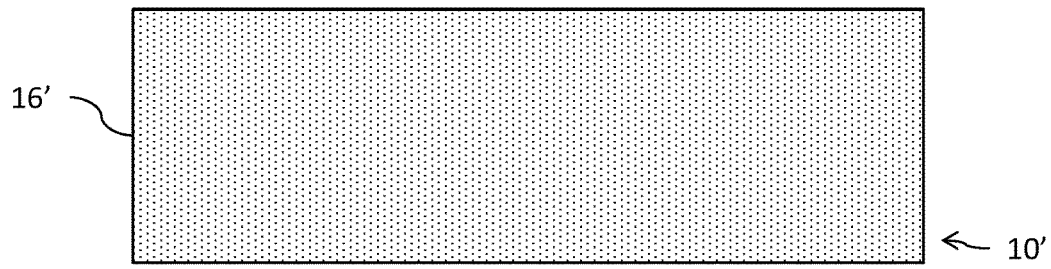
FIGS. 13-23 illustrate process steps in the formation of an RRAM structure for use in a non-volatile memory cell.

FIG. 13 shows a bulk semiconductor substrate 10' comprising a semiconductor layer 16'. The semiconductor layer 16' may be doped in accordance with the application, or alternatively may be un-doped. The semiconductor layer 16' may, for example, have a thickness of 30-80 nm.

Figure 14:
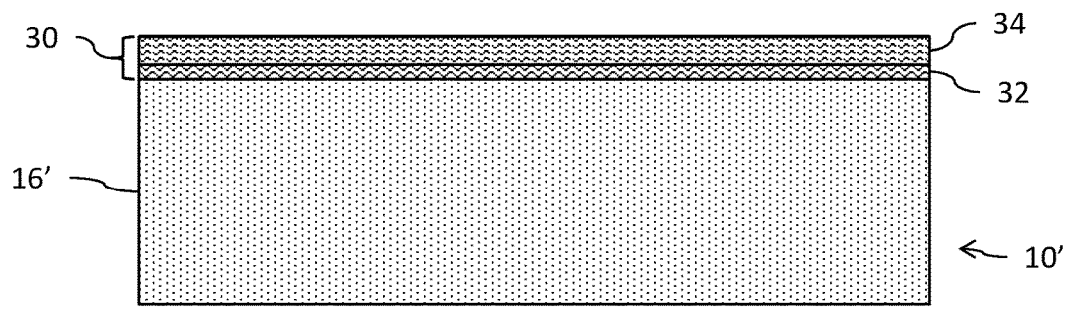

A hard mask 30 comprising a layer of silicon dioxide ($SiO_2$) 32 and a layer of silicon nitride (SiN) 34 is then deposited on the semiconductor layer 16'. The silicon dioxide layer 32 may, for example, be deposited using a chemical vapor deposition (CVD) process with a thickness of, for example, approximately 3-10 nm. The silicon nitride layer 34 may, for example, be deposited using a chemical vapor deposition (CVD) process with a thickness of, for example, approximately 20-40 nm. The result is shown in FIG. 14.

Figure 15:
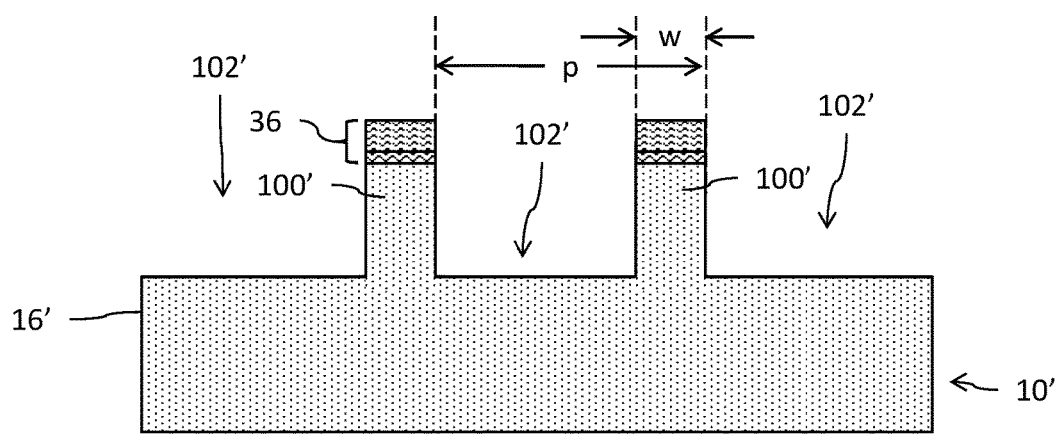

A lithographic process as known in the art is then used to define a plurality of fins 100' from an upper portion of the semiconductor layer 16'. The hard mask 30 is patterned to leave mask material 36 at the desired locations of the fins 100'. An etching operation is then performed through the mask to open apertures 102' on each side of each fin 100'. In a preferred embodiment, the etch which defines the fins 100' extends to a depth of 35-50 nm from the top surface of the semiconductor layer 16'. The fins 100 may have a width (w) of 6-12 nm and a pitch (p) of 25-45 nm (with a spacing between adjacent fins of 15-35 nm). The result of the etching process is shown in FIG. 15.

Figure 16:
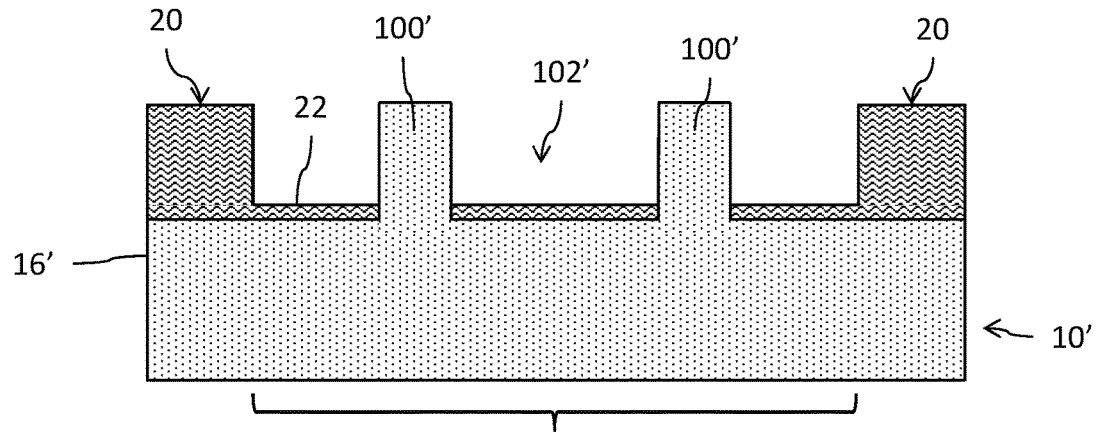

A deposit of a flowable oxide material is made and then planarized using a chemical-mechanical polishing (CMP) process. Within an area 18 where the fins 100 are located, the flowable oxide material deposit is recessed using a dry etch process to leave an insulating layer 22 surrounding a bottom portion 114 of the fins 100'. Outside of the area 18, the insulation is elevated as shown at reference 20. The mask material 36 is also removed. The result is shown in FIG. 16.

Figure 17:
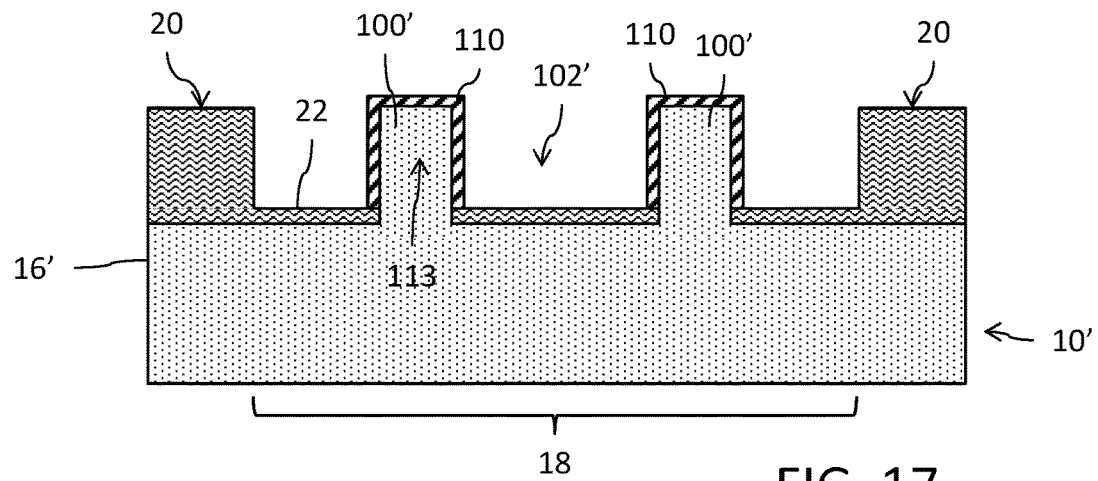
Figure 18:
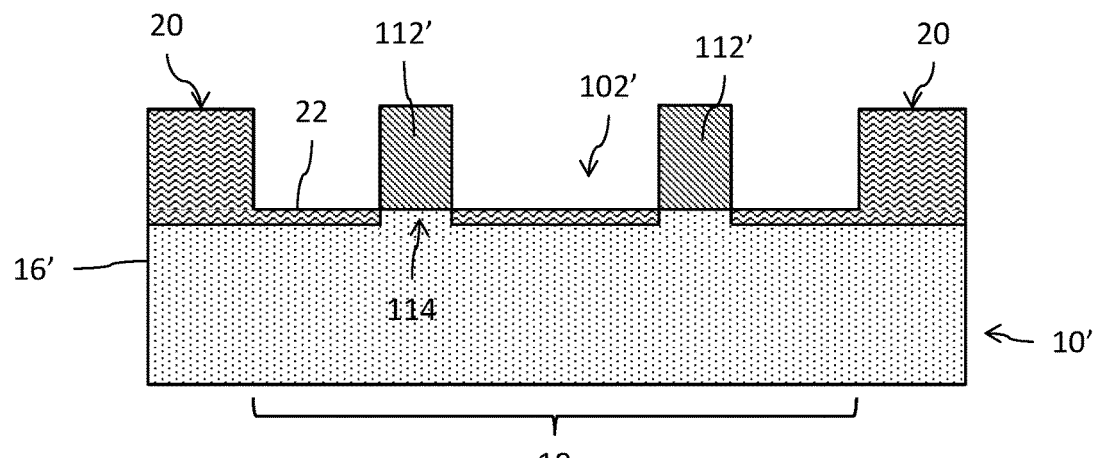

A layer 110 of nickel-platinum (NiPt) is then deposited to cover the fins 100' as shown in FIG. 17. The layer 110 may, for example, have a thickness of 3-10 nm. An anneal is then performed (for example, at 400° C. with an optional laser anneal at 800° C.). The anneal converts at least a portion of the silicon material in an upper portion 113 of the fins 100' to a metal silicide (for example, $NiSi_x$) so as to convert the silicon fin material to form silicided fins 112'. The unreacted portion of the layer 110 is removed. In an embodiment, the dimensions of the fin 100', the thickness of the layer 110', materials used and characteristics of the anneal performed are selected so that the silicided fins 112' are fully-silicided structures (in such a case, all of the semiconductor material of fin 100' in the upper portion 113 is converted to silicide). The result is shown in FIG. 18. It will be noted that the bottom portion 114 of the fin 100' made of non-silicided semiconductor material remains to support each fin 112'. The silicided fin 112' provides one electrode of the RRAM structure.

Figure 19:
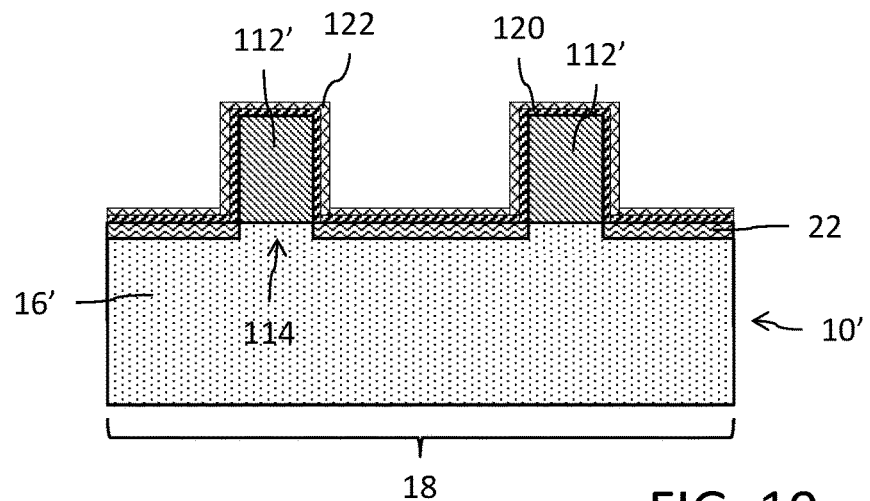

Using a chemical vapor deposition (CVD) process, a liner layer 120 of a metal material (such as, for example, titanium nitride TiN) is deposited to cover the silicided fins 112' and the insulating layer 22. The layer 120 may, for example, have a thickness of 5-10 nm. Using an atomic layer deposition (ALD) process, a layer 122 of a dielectric material (such as, for example, hafnium oxide $HfO_2$) is deposited to cover the metal layer 120. A patterning operation is performed to permit removal of the layers 120 and 122 outside of the area 18. The result is shown in FIG. 19 which now focuses on the area 18. The layer 120 assists in the formation of a low resistivity state across the dielectric layer 122 for the RRAM operation.

Figure 20:
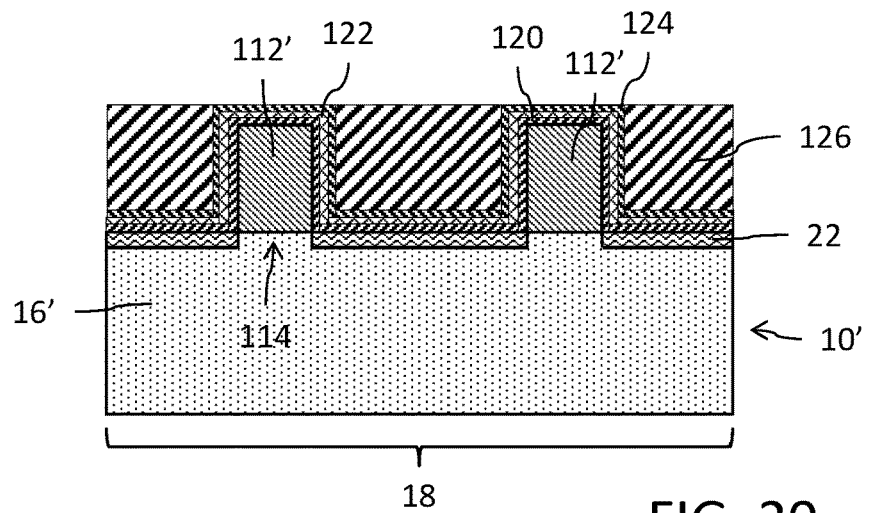

Using a chemical vapor deposition (CVD) process, a liner layer 124 of a metal material (such as, for example, titanium nitride TiN) is deposited to cover the layer 122. The layer 124 may, for example, have a thickness of 5-10 nm. The area 18 is then filled with a metal material (such as, for example, tungsten) to provide a metal fill 126. A chemical-mechanical polishing (CMP) operation is performed to planarize the top surface of the fill 126 at a level which is coplanar with the layer 124. The result is shown in FIG. 20. The layer 124 assists in the formation of a low resistivity state across the dielectric layer 122 for the RRAM operation. The metal fill 126 provides another electrode of the RRAM structure.

Figure 21:
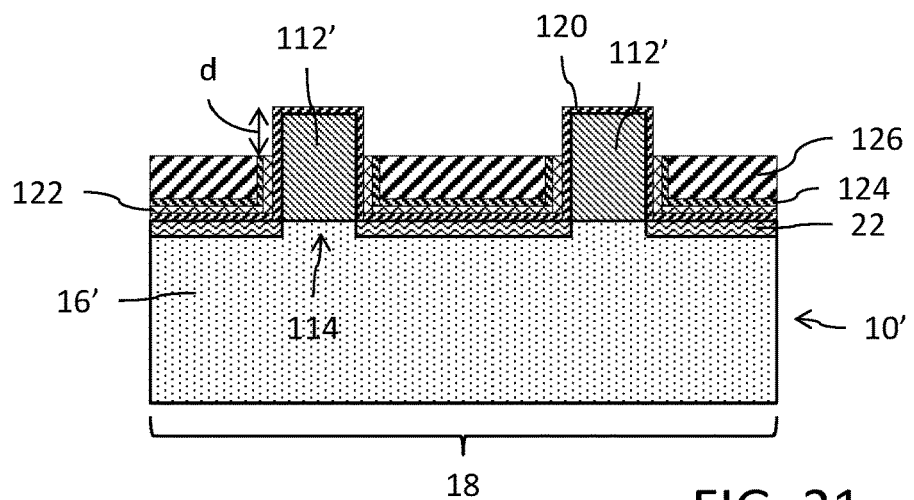

A wet etch process is then used to recess the top surface of the metal fill 126 to a level below the top surface of the silicided fins 112'. The depth d of this recess operation may, for example, be 10-20 nm. The portion of the layer 124 located above the top surface of the recessed metal fill 126' is also removed (for example, using a wet stripping process). The portion of the layer 122 located above the top surface of the recessed metal fill 126' is also removed (for example, using a wet stripping process). The result is shown in FIG. 21.

Figure 22:
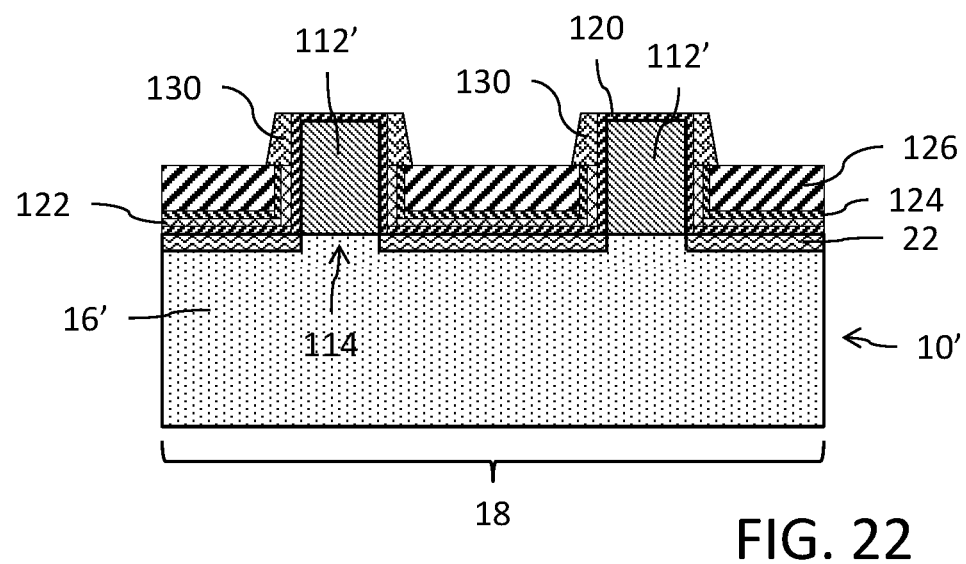

A conformal insulating material deposit is then made with a subsequent directional etch performed to define sidewall spacers 130 on the side surfaces of the layer 120 on each side of the silicided fins 112'. The result is shown in FIG. 22.

Figure 23:
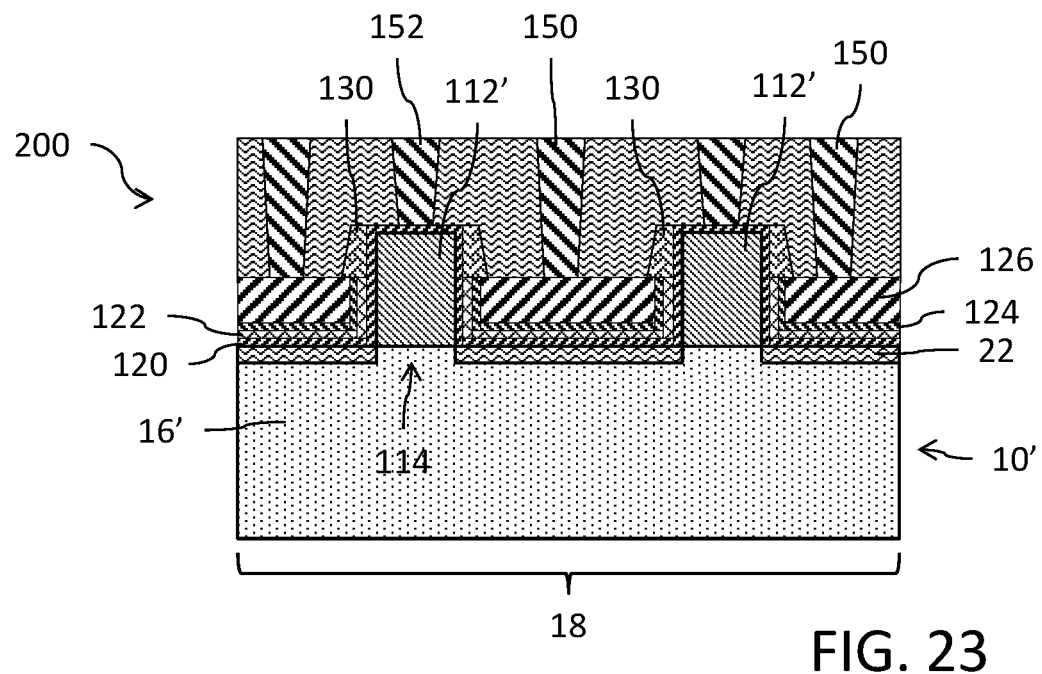

Conventional back end of line (BEOL) processes are then performed to deposit and planarize the premetallization dielectric (PMD) layer 140 and form metal contacts 150 and 152. The result is shown in FIG. 23. One or more metallization layers may then be provided above the PMD layer 140 to assist with making circuit interconnections to the contacts 150 and 152.

A resistive random access memory structure 200 is accordingly formed to include a first metal plate (layer 120 on silicided fin 112'), a dielectric layer 122, and a second metal plate (layer 124 and recessed fill 126'). It will be noted that the structure 200 is comprised of two fins 112', but this is by example only, it being understood that each structure 200 may be formed from the patterning and siliciding of any suitable number of fins 112'. The structure 200 may be included in a non-volatile memory cell 202 as schematically shown in FIG. 12 (previously described).

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A memory cell, comprising:
   a substrate layer;
   a plurality of semiconductor fins on the substrate layer and positioned spaced apart from one another;
   a first metal liner layer on the plurality of semiconductor fins and on the substrate layer;
   a plurality of first contact pillars, each first contact pillar being on the first metal liner layer and located adjacent a different respective one of the plurality of semiconductor fins;
   a configurable resistance structure having a configurable resistance and covering portions of the first metal liner layer that are on each of the plurality of semiconductor fins;
   a metal layer in contact with the configurable resistance structure; and
   a plurality of second contact pillars, each second contact pillar being on the metal layer adjacent a space between adjacent ones of semiconductor fins.

2. The memory cell of claim 1, wherein the configurable resistance structure also covers portions of the first metal liner layer that are on the substrate layer.

3. The memory cell of claim 1, wherein at least one of the plurality of semiconductor fins is silicided.

4. The memory cell of claim 1, wherein the configurable resistance structure comprises:
   a first metal liner layer on each of the plurality of semiconductor fins;
   a dielectric layer disposed on portions of the first metal liner layer; and
   a second metal liner layer on the dielectric layer.

5. The memory cell of claim 4, wherein the dielectric layer comprises hafnium oxide.

6. The memory cell of claim 4, further comprising an insulating layer between the substrate layer and the first metal liner layer and adjacent bottom portions of the plurality of semiconductor fins.

7. The memory cell of claim 6, wherein the insulating layer laterally borders portions of the substrate layer adjacent the bottom portions of the plurality of semiconductor fins.

8. The memory cell of claim 4, further comprising an insulating layer between the substrate layer and the first metal liner layer, and between the substrate layer and each of the plurality of semiconductor fins.

9. The memory cell of claim 1, further comprising a plurality of readout circuits, each readout circuit being coupled to a selected one of the plurality of first contact pillars and to a selected one of the plurality of second contact pillars; and wherein each readout circuit comprises:
 a transistor having a first conduction terminal coupled to the selected one of the plurality of first contact pillars, a second conduction terminal coupled to a source line, and a control terminal coupled to a word line; and
 a bit line coupled to the selected one of the second plurality of contact pillars.

10. The memory cell of claim 9, wherein the configurable resistance structure is configured to switch from a high resistive state to a low resistive state in response to a voltage on the bit line exceeding a first threshold voltage, and is further configured to switch from the low resistive state to the high resistive state in response to the voltage on the bit line falling below a second threshold voltage.

11. The memory cell of claim 1, wherein each of the plurality of semiconductor fins has a width of between six and twelve nanometers, and wherein a pitch of the plurality of semiconductor fins is from twenty five to forty five nanometers; and wherein a spacing between adjacent semiconductor fins of the plurality of semiconductor fins is between fifteen and thirty five nanometers.

12. The memory cell of claim 1, wherein a top of the metal layer is recessed below a top of each of the plurality of semiconductor fins by ten to twenty nanometers.

13. The memory cell of claim 1, wherein the substrate layer comprises an insulating layer on a supporting semiconductor substrate.

14. The memory cell of claim 1, wherein each of the plurality of semiconductor fins is silicided.

15. A memory cell, comprising:
 a substrate layer;
 a plurality of semiconductor fins on the substrate layer and positioned spaced apart from one another;
 a first metal liner layer on the plurality of semiconductor fins and on the substrate layer;
 a dielectric layer on the first metal liner layer except at tops of each of the plurality of semiconductor fins;
 a second metal liner layer on the dielectric layer;
 a metal layer on the second metal liner layer;
 a plurality of first contact pillars, each first contact pillar being on the first metal liner layer adjacent to a different respective one of the plurality of semiconductor fins; and
 a plurality of second contact pillars, each second contact pillar being on the metal layer adjacent a space between adjacent ones of semiconductor fins.

16. The memory cell of claim 15, further comprising a plurality of sidewall spacers, each sidewall spacer being on the metal fill layer adjacent to, and in contact with, the second metal liner layer covering each of the plurality of semiconductor fins.

17. The memory cell of claim 15, wherein each of the plurality of semiconductor fins is silicided.

18. The memory cell of claim 15, wherein the second metal liner layer comprises titanium nitride.

19. The memory cell of claim 18, wherein the second metal liner layer has a thickness of between 5 nm and 10 nm.

20. The memory cell of claim 15, wherein the dielectric layer comprises hafnium oxide.

21. A memory cell, comprising:
 a plurality of semiconductor fins on a substrate layer and positioned in a spaced apart fashion from one another;
 a silicide associated with each of the plurality of semiconductor fins;
 a first metal liner layer on the plurality of silicided semiconductor fins and on the substrate layer;
 a layer of hafnium oxide on the first metal liner layer;
 a second metal liner layer on the layer of hafnium oxide;
 a fill between adjacent ones of the plurality of silicided semiconductor fins that is made of a metal;
 a plurality of first contact pillars on the first metal liner layer adjacent a different respective one of the plurality of silicided semiconductor fins; and
 a second plurality of contact pillars each located on the fill between adjacent ones of silicided semiconductor fins.

22. The memory cell of claim 21, wherein the silicide is made from nickel-platinum.

23. The memory cell of claim 21, wherein the substrate layer comprises a semiconductor layer.

24. The memory cell of claim 23, further comprising an insulating layer on the semiconductor layer between adjacent semiconductor fins.

25. The memory cell of claim 21, wherein the substrate layer comprises an insulating layer stacked on a supporting semiconductor layer.

26. The memory cell of claim 21, wherein each of the plurality of semiconductor fins is fully silicided.

* * * * *